Jan. 13, 1970 W. G. RUSSELL 3,490,046

AUTOMATIC GAIN CONTROL AND OVERLOAD PROTECTION
FOR SIGNAL RECEIVING SYSTEMS
Filed April 5, 1967

INVENTOR.
WILLIAM G. RUSSELL
BY
PATENT AGENT 3,490,046

AUTOMATIC GAIN CONTROL AND OVERLOAD PROTECTION FOR SIGNAL RECEIVING SYSTEMS

William G. Russell, Kitchener, Ontario, Canada, assignor to Electrohome Limited, Kitchener, Ontario, Canada Filed Apr. 5, 1967, Ser. No. 628,648
Int. Cl. H04b 1/16
U.S. Cl. 325—411 7 Claims

ABSTRACT OF THE DISCLOSURE

The gain of a signal amplifier of a signal receiving system is automatically controlled by a network connected between an A.G.C. signal source and the transistor of the signal ampifier. The network includes an A.G.C. signal amplifier including a transistor, the base electrode of the latter being D.C. connected to the A.G.C. signal source, while the emitter electrode of this transistor is D.C. connected with the emitter electrode of the signal amplifier transistor, a D.C. power supply being connected to both the emitter electrodes via a common resistor. A variable impedance network is connected across at least a part of the tuned input circuit of the R.F. amplifier of the system and to the A.G.C. transistor and has a high impedance when the latter is just conducting and a low impedance when the latter is conducting heavily, so that the variable impedance network damps the tuned input circuit when the A.G.C. transistor is conducting heavily.

This invention relates to improvements in automatic gain control (A.G.C.) networks for signal receiving systems, for example, radio receivers. This invention also relates to improvements in A.G.C. and overload protection networks for signal receiving systems.

In a radio receiver having an R.F. and an I.F. amplifier each including a transistor, it is common practise to apply an A.G.C. signal to the base electrode of one or each transistor. However, since there will be a resistor in the emitter circuit of the transistor of the amplifier, and since there will be a voltage drop (normally about 1 volt) across this resistor, and, further, since the base-emitter junction voltage drop of a silicon transistor is about 0.6 volt, an A.G.C. signal change in excess of 1.6 volts will be required before a satisfactory control function can be performed by the A.G.C. network of the receiver. In other words, in such a system, the power requirements of the A.G.C. source are relatively high.

In accordance with one aspect of this invention, there is provided a new and improved A.G.C. system in which the A.G.C. signal is applied to the emitter electrode of the transistor of the amplifier whose gain is to be controlled, thereby eliminating the necessity for the A.G.C. signal to overcome the emitter voltage of the transistor, as in systems where the A.G.C. signal is applied to the base electrode of the transistor. This is accomplished, in accordance with the invention, by the provision of an A.G.C. signal amplifier D.C. connected between the A.G.C. signal source and the emitter electrode of the transistor of the amplifier whose gain is to be controlled. The A.G.C. signal amplifier includes a transistor, and the emitter electrode of this transistor is D.C. connected to the emitter electrode of the other transistor. A D.C. power supply is connected via a resistor to both emitter electrodes.

In a conventional A.M. radio receiver provided with A.G.C. when an overload condition exists, i.e., a very strong signal is being received, even though the R.F. amplifier may be completely cut off by an A.G.C. signal, it is quite common for the signal to be coupled from the tuned input circuit of the R.F. amplifier to the tuned output circuit thereof. This signal is passed to the mixer stage of the receiver where severe overloading occurs causing distortion of the audio signal applied to the loudspeaker of the receiver. This problem can be overcome to some extent by physically locating the coils in the tuned input and output circuits of the R.F. amplifier as far apart as possible, but this does not provide a complete solution, since the overload signal still can be coupled into the mixer stage via the stray capacitance of wiring and of the transistor of the R.F. amplifier.

It is known that the aforementioned overload problem can be solved by the use of a variable impedance network that shunts the tuned input circuit of the R.F. amplifier. This network is virtually an open circuit when weak and medium strength signals are being received. However, during near overload conditions, the impedance of the network drops appreciably, damping the tuned input circuit of the R.F. amplifier, by virtue of which the near overload signal is attenuated at the tuned input circuit to a value less than could cause overload.

In accordance with a preferred embodiment of this invention, a variable impedance network shunting at least a part of the tuned input circuit of an R.F. amplifier is provided, as well as an A.G.C. system of the type hereinbefore briefly described. The variable impedance network includes a diode connected between the tuned input circuit and the collector electrode of the transistor of the A.G.C. signal amplifier, and a resistor connected between this collector electrode and a terminal at a reference potential, e.g., ground potential. The state of conduction of the transistor of the A.G.C. signal amplifier determines the impedance of the variable impedance network. More specifically, as long as the transistor is not conducting heavily, as will be the case for weak and medium strength signals, the variable impedance network will be virtually an open circuit. Under near overload conditions, however, the transistor of the A.G.C. signal amplifier will be conducting heavily causing the diode to conduct, thereby materially reducing the impedance of the variable impedance network.

A feature of this system is that no positive or negative (with respect to ground) potential is required to bias the diode in the variable impedance network off under no signal or weak and medium strength signal conditions. In other words, the D.C. potential of the electrode of the diode connected to the tuned input circuit of the R.F. amplifier can be ground potential. If this were not so, additional components would be required for application of a positive or negative bias to the diode.

This invention will become more apparent from the following detailed description, taken in conjunction with the appended drawings, in which.

Figure 1:
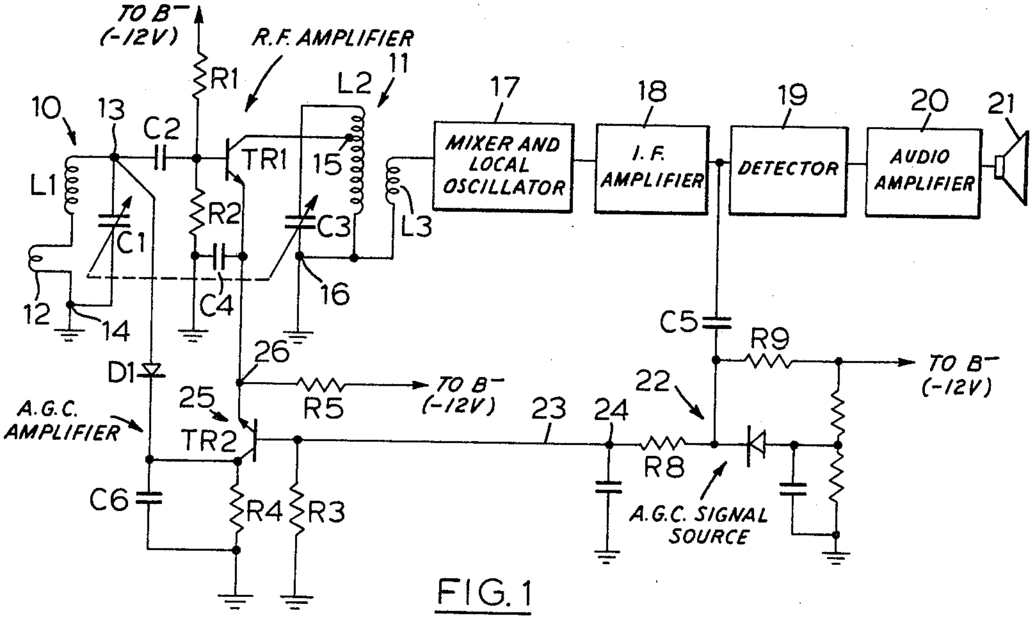
FIGURE 1 shows one form of a radio receiver embodying this invention.

Referring first to FIGURE 1, there is shown an R.F. amplifier including a transistor TR1, a tuned input circuit 10 and a tuned output circuit 11. Tuned input circuit 10 consists of a coil L1 connected in series with the antenna 12 of the receiver, and a variable capacitor C1 connected in parallel with the series circuit consisting of coil L1 and antenna 12, capacitor C1 being connected between the output terminal 13 of tuned input circuit 10 and a terminal 14 at a reference potential, i.e., ground potential. Output terminal 13 is capacitively coupled via a capacitor C2 to the base electrode of transistor TR1.

Tuned output circuit 11 of the R.F. amplifier consists of a coil L2 tapped at 15 and a variable capacitor C3 that may be gang tuned with capacitor C1. One terminal of coil L2 is connected to one terminal of capacitor C3, while the other terminal of coil L2 is connected to the other terminal of capacitor C3. One common terminal of capacitor C3 and coil L2, i.e., terminal 16, is grounded. The collector electrode of transistor TR1 is connected to tap 15.

Bias for transistor TR1 is provided by resistors R1 and R2 connected in series with each other between a negative terminal of a D.C. power supply (B−) and ground, the common terminal of resistors R1 and R2 being connected to the base electrode of transistor TR1. An R.F. by-pass capacitor C4 is connected between the emitter electrode of transistor TR1 and ground.

A coil L3, which is transformer coupled with coil L2, is connected between terminal 16 and a mixer and local oscillator 17, which may be of a conventional type, and provides a path for applying the amplified R.F. signal from the R.F. amplifier to the mixer. The I.F. signal from the mixer is applied to an I.F. amplifier 18, which may be of a conventional type and whose output is supplied to a detector 19, which also may be conventional in nature. The audio signal from detector 19 is amplified by a conventional audio amplifier 20 that supplies an amplified audio signal to loudspeaker 21. The I.F. signal from amplifier 18 also is supplied to an A.G.C. signal source 22 via a coupling capacitor C5. The A.G.C. signal source 22 shown in FIGURE 1 is conventional in nature and requires no detailed description. Of course, other types of A.G.C. signal sources may be employed. The A.G.C. signal on line 23 connected to the output terminal 24 of A.G.C. signal source 22 is a D.C. voltage that is negative with respect to ground. The A.G.C. signal goes less negative, i.e., more positive, with increasing signal strength.

An A.G.C. amplifier 25 that includes a transistor TR2 is provided. A resistor R3 is connected between the base electrode of transistor TR2 and ground. A resistor R4 is connected between the collector electrode of transistor TR2 and ground with an R.F. by-pass capacitor C6 being connected across resistor R4. The emitter electrodes of transistors TR1 and TR2 are D.C. connected, and their common terminal 26 is connected via a resistor R5 to the negative terminal of a D.C. power supply (B−). Output terminal 24 of A.G.C. signal source 22 and the base electrode of transistor TR2 are D.C. connected.

A variable impedance network consisting of a diode D1 and resistor R4 in the collector circuit of transistor TR2 is provided. The anode of diode D1 is connected to output terminal 13 of tuned input circuit 10, while the cathode of diode D1 is connected to the collector electrode of transistor TR2.

Figure 2:
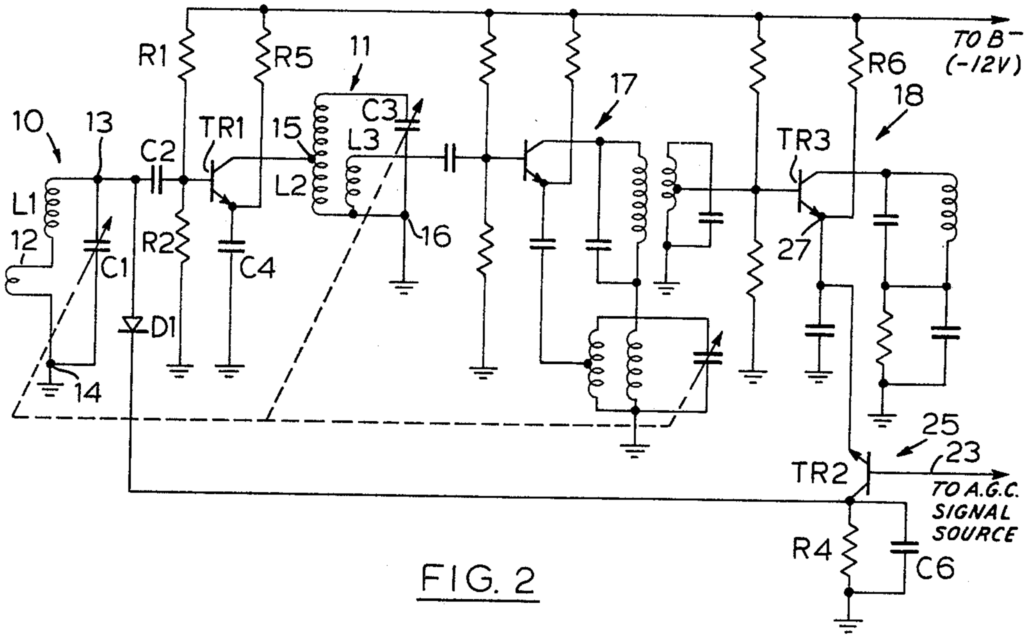
FIGURE 2 shows a part of a radio receiver in which a different embodiment of this invention is employed.

Turning now to FIGURE 2, the circuit shown therein differs from the circuit of FIGURE 1 primarily in that A.G.C. amplifier 25 is connected to transistor TR3 of I.F. amplifier 18, rather than to transistor TR1 of the R.F. amplifier. Thus, the emitter electrodes of transistors TR2 and TR3 are D.C. connected with their common terminal 27 being connected via a resistor R6 to the negative terminal of a D.C. power supply (B−). If desired, a second A.G.C. signal may be obtained at the output circuit of I.F. amplifier 18 and applied to R.F. amplifier transistor TR1.

Returning again to FIGURE 1, resistors R1 and R2 are selected to give the desired operating current. For example, resistors R1 and R2 may be selected so that under no signal conditions the emitter current of transistor TR1 will be 1 ma. If resistor R5 has a value of 1 K., this will mean that under no signal conditions the voltage at terminal 26 will be −11 volts, whereas the voltage at the base electrode of transistor TR1 will be less negative than −11 volts by approximately the base-emitter junction voltage drop of transistor TR1.

Resistor R3 together with resistors R8 and R9 determine the bias for transistor TR2, and these resistors are chosen so that under no signal operating conditions, transistor TR2 will be on the borderline of conduction, i.e., transistor TR2 will have a very small collector current, so that the voltage across resistor R4 will be near zero or very small.

When a signal is being received by antenna 12, the A.G.C. signal applied to the base electrode of transistor TR2 will become less negative, and transistor TR2 will be conducting. The voltage at terminal 26 then will become less negative, the collector current of transistor TR1 will decrease, and the gain of the R.F. amplifier will decrease as required in order to compensate any increase in the signal being received by antenna 12. When transistor TR2 becomes conductive, the voltage at the collector electrode of transistor TR2 will change from essentially ground potential to a negative value, since collector current will pass through resistor R4. However, provided that the signal being received by antenna 12 has not increased to near the point of overload, and, assuming resistor R4 has been chosen properly, the change in voltage at the collector electrode of transistor TR2 will be insufficient to cause diode D1 to conduct. Therefore, the variable impedance network shunting tuned input circuit 10 and consisting of diode D1 and resistor R4 will remain effectively an open circuit.

Under near overload conditions the A.G.C. signal on line 23 will swing sufficiently less negative from its weak signal value to cause transistor TR2 conduct heavily. When transistor TR2 conducts heavily, the voltage at terminal 26 will become even less negative than before, causing transistor TR1 to become non-conductive. At the same time, the increased collector current of transistor TR2 will cause its collector electrode to become sufficiently negative to cause diode D1 to conduct continuously. As soon as diode D1 conducts continuously, there will be a low impedance path shunting tuned input circuit 10, and the tuned input circuit will be damped to such a degree that the R.F. signal at terminal 13 will be appreciably attenuated, so that even if this signal is coupled from tuned input circuit 10 to tuned output circuit 11 by any magnetic coupling between coil L1 and coil L2 or via stray capacitance, it will be unable to overload the mixer stage.

The value of resistor R4 determines the point at which diode D1 will conduct, and resistor R4 should be chosen so that diode D1 will not conduct until a signal that is nearly in the overload region is being received. Under these circumstances, the selectivity of the antenna circuit will be preserved until diode D1 conducts continuously. It also should be noted that the provision of such a variable impedance network shunting tuned input circuit 10 permits the use of a larger antenna than would otherwise be possible, thereby increasing the sensitivity of the receiver and the signal to noise ratio for weak signals.

It is important to note that with A.G.C. network embodying this invention, the swing in voltage at terminal 26 required to cause transistor TR1 to become non-conductive is very small. Thus with transistor TR1 on the borderline of conduction, the voltage of terminal 26 may be −11 volts (no signal), whereas, under strong signal conditions, a swing in voltage at terminal 26 of the order of 0.2 to 0.3 volt to −10.8 or −10.7 volts will cause transistor TR1 to become non-conductive. In effect, a current trading action takes place at terminal 26. Under no signal conditions, there will be emitter current flowing in transistor TR1 but not in transistor TR2. Under conditions where the signal being received is of weak or medium strength, there will be emitter current flowing in both transistors, and, under strong signal conditions, there will be no emitter current flowing in transistor TR1, but emitter current will flow in transistor TR2.

It should be noted that with the system of FIGURE 1, it is not necessary to apply a negative (with respect to ground) potential to the anode of diode D1 to ensure that this diode is held off from continuous conduction except under near overload conditions, since a silicon diode, as used here, requires approximtaely .6 volt to start conduction. Thus, the anode of diode D1 can be connected to ground, as shown.

Because it is only necessary to overcome about 0.2 volt of the 1 volt emitter voltage of tranistor TR1 before full A.G.C. action occurs, the A.G.C. power source (I.F. amplifier 18) will be lightly loaded. The system also provides two negative-going voltages (at terminal 26 and the collector electrode of transistor TR2) to perform A.G.C. and overload control functions, these voltages commencing at the required D.C. values.

The operation of the network shown in FIGURE 2 is essentially the same as the operation of the network of FIGURE 1, except that the A.G.C. signal is applied to the emitter electrode of transistor TR3 of I.F. amplifier 18, rather than to the emitter electrode of transistor TR1, so that, under near overload conditions, the gain of the I.F. amplifier will be materially reduced and tuned input circuit 10 will be shunted by the low impedance network consisting of conducting diode D1 and resistor R4. If A.G.C. is applied to transistor TR1, the R.F. amplifier transistor will be non-conductive under near overload conditions.

Of course, PNP transistors can be substituted for NPN transistors TR1 and TR2 by changing $B^-$ to $B^+$. In this event, it also would be necessary to change the polarity of diode D1, i.e., to connect its anode to the collector electrode of transistor TR2 and its cathode to terminal 13.

It also should be noted that transistors TR1 and TR2 could be field effect transistors. Therefore, where herein reference is made to a transistor having base, collector and emitter electrodes, this terminology is intended to include a field effect transistor having a gate, drain and source respectively.

Furthermore, it is not essential for the variable impedance network to be connected across the whole of tuned input circuit 10. Thus, the variable impedance network could be connected across only antenna coil 12 or across coil L1 or a part thereof, the governing consideration being that the tuned input circuit must be damped when D1 conducts continuously.

Strictly by way of example, the following components of the system of FIGURE 1 may be as follows:

| | |
|---|---|
| R1 | 4700Ω. |
| R2 | 33 K Ω. |
| R3 | 330 K Ω. |
| R4 | 470Ω. |
| R5 | 1000Ω. |
| R8 | 2200Ω. |
| R9 | 10 K Ω. |
| TR1 | Fairchild 1891. |
| TR2 | Fairchild 1891. |
| D1 | Silicon signal diode. |

While preferred embodiments of this invention have been disclosed herein, those skilled in the art will appreciate that changes and modifications may be made therein without departing from the spirit and scope of this invention as defined in the appended claims.

What I claim as my invention is:

1. In a signal receiving system of a type comprising an R.F. signal amplifier having a tuned input circuit and an I.F. signal amplifier, one of said amplifiers including a first transistor having base, collector and emitter electrodes; a source of an A.G.C. signal; and a network interconnecting said one signal amplifier and said source for supplying said A.G.C. signal to said one signal amplifier to automatically control the gain thereof; the improvement wherein said network includes an A.G.C signal amplifier, said A.G.C. signal amplifier including a second transistor having base, collector and emitter electrodes; means D.C. connecting said source and said base electrode of said second transistor for supplying said A.G.C. signal to said base electrode of said second transistor; means D.C. connecting said emitter electrodes of said first and second transistors together; a D.C. power supply; and means including a resistor providing a D.C. path between said D.C. power supply and both of said emitter electrodes and wherein said signal receiving system includes a variable impedance network connected across at least a part of said tuned input circuit and to said second transistor and having a high impedance when said second transistor is just conducting and a low impedance when said second transistor is conducting heavily, whereby under near overload conditions said variable impedance network damps said tuned input circuit.

2. The invention according to claim 1 wherein said one signal amplifier is an R.F. amplifier.

3. The invention according to claim 1 wherein said one signal amplifier is an I.F. amplifier.

4. The invention according to claim 1 wherein said variable impedance network comprises a diode poled to conduct when said second transistor is conducting heavily and connected between said tuned input circuit and said collector electrode of said second transistor, and a second resistor connected between said collector electrode of said second transistor and a terminal at a reference potential.

5. The invention according to claim 4 wherein said variable impedance network is connected across said tuned input circuit.

6. The invention according to claim 4 wherein said diode is a silicon diode.

7. The invention according to claim 1 wherein said variable impedance network is connected across said tuned input circuit.

References Cited

UNITED STATES PATENTS

| | | | |
|---|---|---|---|
| 3,002,090 | 9/1961 | Hirsch | 325—411 XR |
| 3,264,564 | 8/1966 | Guggi | 325—411 |
| 3,356,951 | 12/1967 | Willard | 325—411 XR |
| 3,036,276 | 5/1962 | Brown | 325—411 |

ROBERT L. GRIFFIN, Primary Examiner

C. R. VON HELLENS, Assistant Examiner

U.S. Cl. X.R.

325—380, 478